United States Patent
Kim et al.

(10) Patent No.: US 10,858,730 B2
(45) Date of Patent: *Dec. 8, 2020

(54) MULTILAYER THIN FILMS EXHIBITING PERPENDICULAR MAGNETIC ANISOTROPY

(71) Applicant: KOREA UNIVERSITY RESEARCH AND BUSINESS FOUNDATION, Seoul (KR)

(72) Inventors: Young Keun Kim, Seoul (KR); Yong Jin Kim, Chungcheongbuk-do (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 399 days.

This patent is subject to a terminal disclaimer.

(21) Appl. No.: 15/599,259

(22) Filed: May 18, 2017

(65) Prior Publication Data

US 2018/0166627 A1 Jun. 14, 2018

(30) Foreign Application Priority Data

Dec. 14, 2016 (KR) .......................... 10-2016-017114

(51) Int. Cl.
*C23C 14/34* (2006.01)
*H01L 43/12* (2006.01)
(Continued)

(52) U.S. Cl.
CPC ........ *C23C 14/3464* (2013.01); *C23C 14/067* (2013.01); *C23C 14/165* (2013.01);
(Continued)

(58) Field of Classification Search
CPC . C23C 14/067; C23C 14/165; C23C 14/3464; C23C 14/0682; C23C 14/14;
(Continued)

(56) References Cited

U.S. PATENT DOCUMENTS 4,396,577 A  8/1983  Smith, Jr. et al.
8,374,025 B1 * 2/2013  Ranjan ................... B82Y 10/00
                                                    365/148

(Continued)

FOREIGN PATENT DOCUMENTS

JP    S62-60113 A    3/1987
JP    H07-86038 A    3/1995
(Continued)

OTHER PUBLICATIONS

Sol Jung et al. , Amorphous Ferromagnetic CoSiB/Pd Multilayer with Perpendicular Magnetic Anisotropy, Journal of the Korean Physical Society,Jan. 2013, vol. 62, No. 1, pp. LIO-L13.

(Continued)

*Primary Examiner* — Holly C Rickman
(74) *Attorney, Agent, or Firm* — Jenkins, Wilson, Taylor & Hunt, P.A.

(57) ABSTRACT

A method for forming a multilayer thin film exhibiting perpendicular magnetic anisotropy includes alternately sputtering a CoFeSiB target and a Pd target inside a vacuum chamber to form a [CoFeSiB/Pd] multilayer thin film on a substrate disposed inside the vacuum chamber. The number of times the [CoFeSiB/Pd] multilayer thin film is stacked may be 3 or more.

6 Claims, 15 Drawing Sheets

(51) Int. Cl.
*H01F 10/14* (2006.01)
*C23C 14/16* (2006.01)
*C23C 14/06* (2006.01)
*H01F 41/18* (2006.01)
*H01F 10/32* (2006.01)
*H01L 43/10* (2006.01)
*H01L 43/08* (2006.01)

(52) U.S. Cl.
CPC ....... *H01F 10/142* (2013.01); *H01F 10/3236* (2013.01); *H01F 10/3286* (2013.01); *H01F 41/18* (2013.01); *H01L 43/12* (2013.01); *H01F 10/3272* (2013.01); *H01L 43/08* (2013.01); *H01L 43/10* (2013.01)

(58) Field of Classification Search
CPC ............. H01F 10/3236; H01F 10/3272; H01F 10/142; H01F 10/16; H01F 10/3286; H01F 41/18; H01L 43/08; H01L 43/12; H01L 43/10
See application file for complete search history.

(56) References Cited

U.S. PATENT DOCUMENTS

| | | | | |
|---|---|---|---|---|
| 8,508,984 B2* | 8/2013 | Ranjan | .................... | H01L 43/08 365/158 |
| 8,852,761 B2 | 10/2014 | Kim et al. | | |
| 9,047,881 B2* | 6/2015 | Edelstein | ................ | G11C 11/16 |
| 2013/0108889 A1* | 5/2013 | Piramanayagam | .. | G01R 33/093 428/811.2 |
| 2013/0244058 A1* | 9/2013 | Kim | ........................ | G11B 5/656 428/828 |
| 2013/0334632 A1* | 12/2013 | Park | ...................... | H01L 27/224 257/421 |
| 2015/0236071 A1 | 8/2015 | Lee et al. | | |
| 2018/0166628 A1* | 6/2018 | Kim | ........................ | H01L 43/10 |

FOREIGN PATENT DOCUMENTS

| | | |
|---|---|---|
| JP | 2694110 B2 | 9/1997 |
| JP | 2006-253637 A | 9/2006 |
| JP | 2008-135676 A | 6/2008 |
| JP | 4586040 | 9/2010 |
| JP | 2015-534272 A | 11/2015 |
| JP | 6219395 B2 | 10/2017 |
| JP | 6375414 B2 | 8/2018 |
| KR | 10-1995-0006452 A | 3/1995 |
| KR | 10-2008-0048151 A1 | 6/2008 |
| KR | 10-2011-0083403 A | 7/2011 |
| KR | 101519767 B1 | 5/2015 |
| KR | 101738828 B1 | 5/2017 |

OTHER PUBLICATIONS

Sol Jung et al. , Perpendicular Magnetic Anisotropy in coSiB/Pd Multi layers with Various Thicknesses, Journal of the Korean Physical Society, Jan. 2013, vol. 62, No. 2, pp. L201-L205.
Sol Jung et al., "Dependence of Perpendicular Magnetic Anisotropy and Hall Resistivity on Pd-layer Thickness in CoSiB/Pd Multilayer", Journal of the Korean Physical Society, Aug. 2015 , vol. 67, No. 3, pp. 547-550.
Gusev et al., "Effect of thermal annealing on the magnetic properties of thin films of Co Pd alloys," Technical Physics, US, American Institute of Physics, vol. 43, No. 4, pp. 407-411, Apr. 1998.
Yoon et al., "Time-dependent magnetization reversal in amorphous CoSiB/Pd multilayers with perpendicular magnetic anisotropy," Journal of Applied Physics, US, AIP Publishing, vol. 113, No. 17, pp. 17A342-1-17A342-3, Apr. 12, 2013.
Office Action for Korean Application No. 10-2016-0170108 dated Feb. 27, 2017.
Office Action for Korean Application No. 10-2016-0170114 dated Feb. 27, 2017.
Notice of Allowance for Korean Application No. 10-2016-0170108 dated May 10, 2017.
Notice of Allowance for Korean Application No. 10-2016-0170114 dated May 10, 2017.
Office Action for Japanese Application No. JP 2017-099031 dated Jan. 23, 2018.
Office Action for Japanese Application No. JP 2017-098812 dated Jun. 5, 2018.
Notice of Allowance for Japanese Application No. JP 2017-099031 dated Jun. 26, 2018.
Notice of Allowance for Japanese Application No. JP 2017-098812 dated Oct. 23, 2018.
Restriction Requirement for U.S. Appl. No. 15/599,283 dated May 3, 2019.
Nishimura, et al., "Magnetic tunnel junction device with perpendicular magnetization films for high-density magnetic random access memory," Journal of Applied Physics, vol. 91, No. 8, pp. 5246-5249, Apr. 15, 2002.
Jung, et al., "Effects of Rapid Thermal Annealing on the Magnetic Properties of CoSiB/Pd Multilayers with Perpendicular Anisotrophy," Journal of Korean Physical Society, vol. 65, No. 1, pp. 65-69, Jul. 2014.
Final Office Action for U.S. Appl. No. 15/599,283 dated May 13, 2020.
Non-Final Office Action for U.S. Appl. No. 15/599,283 dated Oct. 30, 2019.

* cited by examiner (a)

(b)

MULTILAYER THIN FILMS EXHIBITING PERPENDICULAR MAGNETIC ANISOTROPY

CROSS-REFERENCE TO RELATED APPLICATIONS

This U.S. non-provisional application claims priority under 35 U.S.C. § 119 to Korea Patent Application No. 10-2016-0170114 filed on Dec. 14, 2016, the entirety of which is incorporated by reference herein.

TECHNICAL FIELD

The present disclosure relates to magnetic multilayer thin films and, more particularly, to a magnetic multilayer thin film which maintains perpendicular magnetic anisotropy even when a high-temperature annealing of about 500 degrees Celsius is performed and a magnetic memory device using the magnetic multilayer thin film.

BACKGROUND

Among the next-generation memories for replacing conventional memories, a magnetic random access memory (MRAM) is a nonvolatile memory and is increasingly becoming attractive due to its advantages such as high driving speed, low driving voltage, and high information retention durability.

Since magnetic memories can realize both high bit density a dynamic random access memory (DRAM) and high speed of a static random access memory (SRAM), they are being magnified as alternative means of conventional memories used in a smartphone, a computer, and a network. Moreover, there are attempts to apply magnetic memories to electronic products for Internet of Things (IoT) which requires low power and non-volatility and there is a strong probability that magnetic memories will be used in automobiles, robots, and the like.

A magnetic tunnel junction (MTJ) is a core element of an MRAM and should achieve perpendicular magnetic anisotropy (PMA) to implement high tunneling magnetoresistance ratio (TMR), high writing stability, low current density, and high integration.

A magnetic tunnel junction (MTJ) has a three-layered structure in which ferromagnetic substance/oxide/ferromagnetic substance are stacked The ferromagnetic material/oxide/ferromagnetic material structure includes a pinned layer (PL), a tunnel barrier (TB), and a free layer (FL), respectively. Positions of the free layer and the pinned layer are interchangeable. The magnitude of tunneling current passing through a tunnel barrier varies depending on a state in which a spin direction of a free layer and a pinned layer arranged adjacent to each other with the tunnel barrier interposed therebetween is parallel or antiparallel. At this point, a resistance difference is called a tunnel magnetoresistance ratio (TMR). A spin direction of the pinned layer fixed and may be handled by applying a magnetic field or current to input information.

The magnetic tunnel junction (MTJ) has a sandwich shape of two ferromagnetic layers with an insulating layer (generally, MgO) interposed therebetween as a tunnel barrier and exhibits a phenomenon in which current flows vertically to each layer. The two ferromagnetic layers include a pinned layer acting as a reference layer and a free layer having a storing or sensing function. If magnetization directions of the two ferromagnetic layers are identical to each other (parallel) when current flows, a resistance is low and tunneling probability of the current is high. Meanwhile, if the magnetization directions of the two ferromagnetic layers are opposite to each other (antiparallel) when the current flows, the resistance is high and the tunneling probability of the current is low. A memory cell of sub-micrometer unit needs to be formed to achieve very high bit density of a magnetic memory. When an aspect ratio of the cell is reduced while a size of the magnetic tunnel junction is reduced to achieve high bit density of the magnetic layer, a multi-domain or a vortex is formed in a magnetic body of the magnetic tunnel junction by a multi-domain or a vortex to cause an unstable cell switching phenomenon. Thus, a write margin is reduced.

If a cell is formed with a high aspect ratio, such a multi-domain structure is not formed by shape magnetic anisotropy but cannot achieve high integration density and requires a large switching magnetic field. As a result, high integration density cannot be achieved.

For the above reasons, a magnetic field having perpendicular magnetic anisotropy (PMA) was developed (Naoki Nishimura et al., J. Appl. Phys., vol. 91, p. 5246. 2002). Nishimura's group controlled a magnetic tunnel junction to obtain a magnetoresistance ratio of 55 percent by using TbFeCo and GdFeCo, which are well-known materials exhibiting perpendicular magnetic anisotropy, as a free layer and a pinned layer, respectively. In addition, through a magnetic force microscope (MFM), the Nishimura's group confirmed that magnetization distortion does not occur with an MTJ with perpendicular magnetic anisotropy (PMA). However, Tb, Gd, and the like used in this test cannot be commercialized because they are rare-earth metals that are not abundant on the earth. Thus, new perpendicular anisotropy materials need to be developed to commercialize the MTJ with perpendicular magnetic anisotropy (PMA).

Traditionally studied PMA thin films have been developed to replace an in plane magnetic recording medium that will encounter a limitation in high density. Materials exhibiting perpendicular magnetic anisotropy are CoCr-based alloy film, Co/Pt, Co/Pd multilayer thin film, and the like. Physical properties required for these materials include high perpendicular magnetic anisotropy, high coercivity, and high remanent magnetization values to achieve both stability and reliability of a recording magnetic domain.

However, a magnetic memory requires fast switching and a low-power operation. Thus, high magnetic anisotropy is required to improve low coercivity and reading margin. A remanent magnetization value and a saturation magnetization value are similar to each other and need to remain small to reduce power consumption.

A magnetic tunnel junction having perpendicular magnetic anisotropy is briefly referred to as a perpendicular magnetic tunnel junction (pMTJ). A thin film with PMA having low coercivity and high magnetic anisotropy values is required to be used as a free layer of a pMTJ. Additionally, a thin film with PMA is required to be used as a pinned layer of the pMTJ to obtain high coercivity and high thermal stability.

In general, a magnetic tunnel junction is formed by deposition such as sputtering or molecular beam epitaxy (MBE). However, materials exhibiting perpendicular magnetic anisotropy are limited and are significantly affected by a fine structure and an interface change of a deposited film. In particular, an important technical issue is to maintain perpendicular magnetic anisotropic characteristics at a high temperature (conventionally, 400 degrees Celsius or higher) required for a back-end-of-line (BEOL) among semiconductor processes.

A multilayer thin film can easily provide a structural modification while maintaining PMA which results in an advantage to control magnetic properties. However, a fatal disadvantage of a conventional multilayer thin film is the PMA is weakened after annealing of about 250 degrees Celsius. Currently, there is a need for a novel magnetic material for a free layer or a pinned layer which maintains strong perpendicular magnetic anisotropy even after high-temperature annealing of about 400 degrees Celsius.

SUMMARY

A feature of the present disclosure is to provide a magnetic layer required for a magnetic tunnel junction which maintains perpendicular magnetic anisotropy even after high-temperature annealing.

Features of the present disclosure are not limited to the above-mentioned object, and other features not described herein will be clearly understood by those skilled in the art from the following description.

A method to form a CoFeSiB/Pd multilayer thin film exhibiting perpendicular magnetic anisotropy according to an example embodiment of the present disclosure includes: alternating sputter-deposition of a CoFeSiB target and a Pd target inside a vacuum chamber to form the [CoFeSiB/Pd] multilayer thin film on a substrate disposed inside the vacuum chamber. The number of times the [CoFeSiB/Pd] multilayer thin film is stacked may be 3 or more.

In an example embodiment, the method may further include: forming a buffer layer before forming the [CoFeSiB/Pd] multilayer thin film.

In an example embodiment, the method may further include: forming a seed layer before forming the buffer layer; and forming a capping layer after forming the [CoFeSiB/Pd] multilayer thin film.

In an example embodiment, the [CoFeSiB/Pd] multilayer thin film may be formed by direct current (dc) sputtering using the CoFeSiB target and the Pd target.

In an example embodiment, a composition ratio of the CoFeSiB target may be $Co_xFe_ySi_{15}B_{10}$ (atomic percent), and x=70.5~75 and y=4.5~0.

In an example embodiment, the [CoFeSiB/Pd] multilayer thin film may be deposited under an atmosphere of argon and an atmosphere of 1 mTorr to 10 mTorr.

In an example embodiment, a ratio of a thickness of CoFeSiB to a thickness of Pd may be 1:1.6 to 1:7.

In an example embodiment, a squareness of the [CoFeSiB/Pd] multilayer thin film may be 90 percent or more, saturation magnetization of the [CoFeSiB/Pd] multilayer thin film may be 200 emu/cm$^3$ or more, and magnetic anisotropy energy may be $1.0\times10^6$ erg/cm$^3$ or more.

A method for forming a CoSiB/Pd multilayer thin film according to an example embodiment of the present disclosure includes: alternately sputtering a CoSiB target and a Pd target inside a vacuum chamber to form the [CoSiB/Pd] multilayer thin film on a substrate disposed inside the vacuum chamber. The number of times the [CoSiB/Pd] multilayer thin film is stacked may be 3 or more.

In an example embodiment, the method may further include: forming a buffer layer before forming the [CoSiB/Pd] multilayer thin film.

In an example embodiment, the method may further include: forming a seed layer before forming the buffer layer; and forming a capping layer after forming the [CoSiB/Pd] multilayer thin film.

In an example embodiment, the [CoSiB/Pd] multilayer thin film may be formed by dc sputtering using the CoSiB target and the Pd target.

In an example embodiment, a composition ratio of the CoSiB target may be $Co_{75}Si_{15}B_{10}$ (atomic percent).

In an example embodiment, the [CoSiB/Pd] multilayer thin film may be deposited under an atmosphere of argon and an atmosphere of 1 mTorr to 10 mTorr.

In an example embodiment, a ratio of a thickness of the CoSiB to a thickness of the Pd may be 1:1.6 to 1:7.

A CoFeSiB/Pd multilayer thin film exhibiting perpendicular magnetic anisotropy according to an example embodiment of the present disclosure includes: a [CoFeSiB/Pd] multilayer thin film disposed on a substrate. The number of times the [CoFeSiB/Pd] multilayer thin film is stacked may be 3 or more.

In an example embodiment, a squareness of the [CoFeSiB/Pd] multilayer thin film may be 90 percent or more, saturation magnetization of the [CoFeSiB/Pd] multilayer thin film may be 200 emu/cm$^3$ or more, and magnetic anisotropy energy may be $1.0\times10^6$ erg/cm$^3$ or more.

In an example embodiment, a thickness of the [CoFeSiB/Pd] multilayer thin film may be between 9.5 and 20 nm, and a ratio of a thickness of CoFeSiB to a thickness of Pd may be 1:1.6 to 1:7.

In an example embodiment, the CoFeSiB/Pd multilayer thin film may further include: a buffer layer below the [CoFeSiB/Pd] multilayer thin film; and a seed layer below the buffer layer. The buffer layer may be Pd and may have a thickness of 3 nm or more. The seed layer may be Ta.

A CoSiB/Pd multilayer thin film exhibiting perpendicular magnetic anisotropy according to an example embodiment of the present disclosure includes: a [CoSiB/Pd] multilayer thin film disposed on a substrate. The number of times the [CoSiB/Pd] multilayer thin film is stacked may be 3 or more.

In an example embodiment, a squareness of the [CoSiB/Pd] multilayer thin film exhibiting the perpendicular magnetic anisotropy may be 90 percent or more, and saturation magnetization of the [CoSiB/Pd] multilayer thin film may be 200 emu/cm$^3$ or more.

In an example embodiment, a thickness of the [CoSiB/Pd] multilayer thin film may be between 9.5 and 20 nm, and a ratio of a thickness of CoSiB to a thickness of Pd may be 1:1.6 to 1:7.

In an example embodiment, the CoSiB/Pd multilayer thin film may further include: a buffer layer below the [CoSiB/Pd] multilayer thin film; and a seed layer below the buffer. The buffer layer may be Pd and may have a thickness of 3 nm or more. The seed layer may be Ta.

A magnetic tunnel junction includes a tunnel insulating layer interposed between a free layer whose magnetization direction is switched and a pinned layer whose magnetization direction is fixed. The pinned layer may include: a seed layer; a buffer layer disposed on the seed layer; and a first pinned layer disposed on the buffer layer. The first pinned layer may include a [CoFeSiB/Pd] multilayer thin film or a [CoSiB/Pd] multilayer thin film. The number of times the [CoFeSiB/Pd] multilayer thin film or the [CoSiB/Pd] multilayer thin film is stacked may be 3 or more.

In an example embodiment, the pinned layer may further include a non-magnetic metal layer disposed on the first pinned layer and a second pinned layer disposed on the non-magnetic metal layer. The second pinned layer may include a CoFeB thin film exhibiting perpendicular magnetic anisotropy.

BRIEF DESCRIPTION OF THE DRAWINGS

The present disclosure will become more apparent in view of the attached example drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
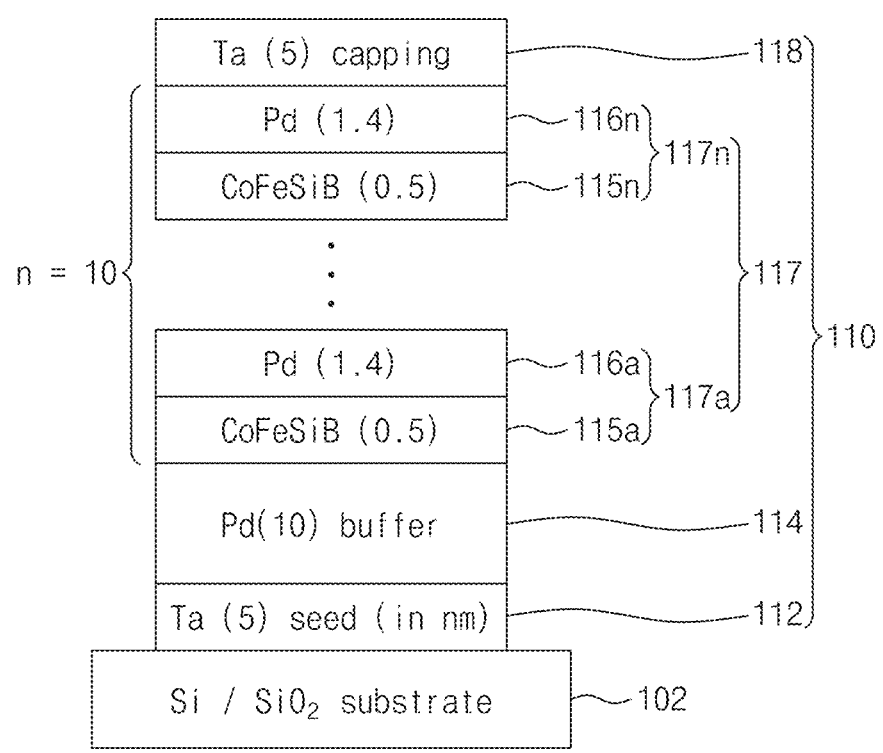
FIG. 1 is a cross-sectional view of a perpendicular magnetic anisotropic multilayer thin film according to an example embodiment of the present disclosure.

A magnetic tunnel junction (MTJ) makes a low-current-density operation having high bit stability possible. Thus, magnetic tunnel junctions (MTJs) having perpendicular magnetic anisotropy (PMA) may be used in a nonvolatile magnetic random access memory.

Conventionally, an MTJ device with PMA (pMTJ) requires TMR of 100 percent or higher, writing stability of 60 or more, and low critical current required for magnetization reversal.

Moreover, a magnetic tunnel junction should endure a back-end-of-line (BEOL) integrated circuit process including a high temperature of about 400 degrees Celsius. Accordingly, when the magnetic tunnel junction is exposed to a high temperature, degradation in perpendicular magnetic anisotropy is problematic. As a result, it is important to search a material which can endure high-temperature annealing while maintaining desired magnetic properties such as perpendicular magnetic anisotropy.

Conventionally, a multilayer thin film structure exhibits perpendicular magnetic anisotropy before annealing. However, to secure a back-end-of-line (BEOL) thermal resistance, a key point of the multilayer thin film structure is to continuously maintain perpendicular magnetic anisotropy even after post-deposition annealing.

Several ferromagnetic systems including rare-earth transition-metal alloys such as TbFeCo and GdFeCo exhibit perpendicular magnetic anisotropy properties.

However, a magnetic tunnel junction including these alloys loses the perpendicular magnetic anisotropy after post-deposition annealing of 200 degrees Celsius or higher.

Another system includes L1$_0$ ordered alloys such as FePd and FePt. The ordered alloys provide large uniaxial anisotropy constant (K$_u$) values in the range of $10^7$ erg/cm$^3$. However, since the ordered alloys require a high-temperature treatment of 500 degrees centigrade or higher during deposition of a thin film, it is difficult to achieve chemical ordering.

Another system having perpendicular magnetic anisotropy is a well-known cobalt-based multiplayer thin film such as Co/Pd, Co/Pt, CoFe/Pd or CoFe/Pt. Important magnetic properties such as saturation magnetization (M$_s$) and uniaxial anisotropy constant (K$_u$) may be adjusted by changing thicknesses of a ferromagnetic layer and a non-magnetic layer and the number of bilayers.

A thickness of a pinned layer constituting a cobalt-based multilayer thin film ranges from 5 nm to 20 nm. The number (n) of repeated bilayers may vary from 5 to 10. A cause of perpendicular magnetic anisotropy with respect to a Co/Pd multilayer thin film is known as an interfacial effect resulting from lowered symmetry at the interface or stressed interfacial alloying between a ferromagnetic layer and a non-magnetic layer.

Additionally, it is known that the perpendicular magnetic anisotropy is degraded at a cobalt-based multilayer thin film during annealing of 300 degrees Celsius or higher due to Co—Pd interdiffusion or Pd diffusion at Co/Pd interface. It is known that perpendicular magnetic anisotropy materials used in a conventional MTJ are significantly affected by a fine structure and interface change of a deposited layer.

In the present disclosure, we investigated perpendicular magnetic anisotropy characteristics at a [CoFeSiB/Pd] multilayer thin film (or a [CoSiB/Pd] multilayer thin film). The [CoFeSiB/Pd] multilayer thin film (or the [CoSiB/Pd] multilayer thin film) maintained magnetic anisotropy even when being exposed to annealing at a temperature of about 500 degrees Celsius.

An example embodiment of the present disclosure provides a magnetic multilayer thin film which maintains perpendicular magnetic anisotropy even after an annealing process of 300 degrees Celsius or higher. The multilayer thin film may be used as a pinned layer or a free layer of a magnetic tunnel junction.

A multilayer thin film according to an example embodiment of the present disclosure may be applied to a magnetic tunnel junction having a CoFeB (free layer)/MgO (tunnel barrier)/CoFeB (pinned layer) structure which causes a high tunnel magnetic resistance (TMR). More specifically, the multilayer thin film may be applied to Pd/[CoFeSiB/Pd]n/W (or Ta)/CoFeB/MgO (tunnel barrier)/CoFeB. Thus, high annealing stability of the level of 400 degrees Celsius may be secured while having a high TMR value.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

FIG. 1 is a cross-sectional view of a perpendicular magnetic anisotropic multilayer thin film according to an example embodiment of the present disclosure.

Referring to FIG. 1, a method for forming a perpendicular anisotropy multilayer thin film 110 includes alternately sputtering a CoFeSiB target and a Pd target inside a vacuum chamber to form a [CoFeSiB/Pd] multilayer thin film 117 on a substrate disposed inside the vacuum chamber.

A seed layer 112, a buffer layer 114, a [CoFeSiB/Pd] multilayer thin film 117, and a capping layer 118 may be sequentially stacked on a silicon substrate 102. The seed layer 112 may be Ta of 5 nm, the buffer layer 114 may be Pd of 10 nm, the number of times (n) the [CoFeSiB/Pd] multilayer thin film 117 is stacked may be 10, a CoFeSiB layer 115a to 115n may be 0.5 nm, and a Pd layer 116a to 116n may be 1.4 nm. The capping layer 118 may be Ta of 5 nm.

A perpendicular magnetic anisotropy thin film specimen according to an example embodiment of the present disclosure was prepared as follows. The perpendicular magnetic anisotropy thin film 110 may be silicon substrate/silicon oxide/Ta 5/Pd 10/[CoFeSiB 0.5/Pd 1.4]$_{10}$/Ta 5 (thickness unit: nm). The silicon substrate is single crystalline, the silicon oxide is silicon oxide having a thickness of 300 nm formed on the silicon substrate, the Ta is a seed layer, and the Pd is a buffer layer. The other Ta is a capping layer. The [CoFeSiB/Pd] multilayer thin film 117 is a multilayer thin film deposited by sputtering. The [CoFeSiB/Pd] multilayer thin film 117 is formed by alternately depositing CoFeSiB having a thickness of 0.5 nm and Pd having a thickness of 1.4 nm. Thus, the total thickness of the [CoFeSiB/Pd] multilayer thin film 117 is 19 nm.

According to an example embodiment of the present disclosure, a [CoFeSiB 0.5/Pd 1.4] multilayer thin film is formed by dc magnetron sputtering. A magnetron sputtering system has a base pressure of $5\times10^{-9}$ Torr or less. A thickness of a thin film may be adjusted through deposition time and sputtering power. The magnetron sputtering system includes a CoFeSiB target and a Pd target. A composition ratio of the CoFeSiB target is $Co_{70.5}Fe_{4.5}Si_{15}B_{10}$ (each number being atomic percent). The [CoFeSiB 0.5/Pd 1.4] multilayer thin film in the as-deposited state exhibits perpendicular magnetic anisotropy.

For example, to deposit a thin film, a dc power density may be 2.5 W/cm$^2$ and a pure argon pressure may be maintained at about 2 mTorr. Deposition rates of CoFeSiB and Pd may be 0.0298 nm/s and 0.127 nm/s, respectively. The deposition rates may be controlled by adjusting power applied to a target. A structure of the thin film is Si/SiO$_2$/Ta (seed layer) 5/Pd (buffer layer) 10/[CoFeSiB0.5/Pd 1.4]$_{10}$/Ta (capping layer) 5 (unit: nm). The seed layer is Ta and functions as an adhesion layer. The capping layer is Ta and functions as a protection layer. The deposited [CoFeSiB/Pd] multilayer thin film 117 is in an amorphous state and exhibits perpendicular magnetic anisotropy.

[Post-Deposition Annealing Stability of Thin Film]

After formation of the [CoFeSiB/Pd] multilayer thin film 117, the silicon substrate 102 was annealed in a heat treating furnace. Samples were annealed at temperatures of 300 degrees Celsius, 400 degrees Celsius, and 500 degrees Celsius for an hour after deposition of the thin film, respectively. The annealing was performed for an hour under $10^{-6}$ Torr vacuum with an applied external magnetic field of 6 kOe. After the subsequent annealing, the [CoFeSiB 0.5/Pd 1.4] multilayer thin film 117 maintained perpendicular magnetic anisotropy.

Figure 2:
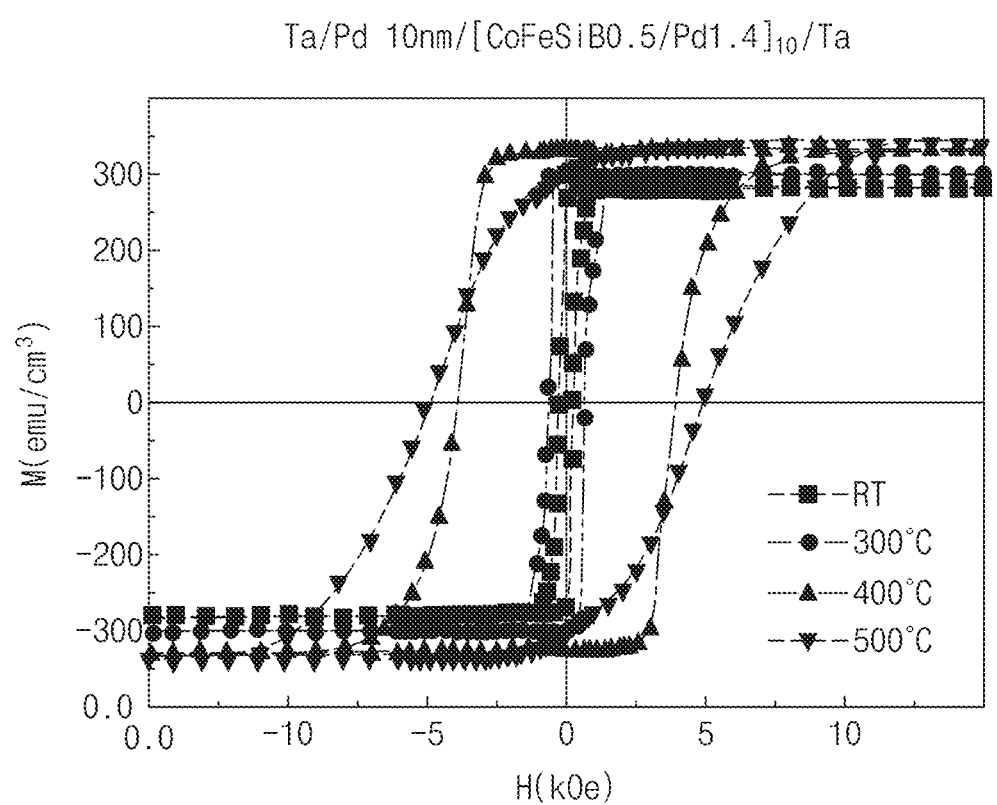
FIG. 2 shows a magnetic hysteresis curve depending on an annealing temperature measured by a vibrating sample magnetometer (VSM).

FIG. 2 shows a magnetic hysteresis curve depending on an annealing temperature measured by a vibrating sample magnetometer (VSM).

Referring to FIG. 2, a first sample has a structure of Ta/Pd 10 nm/[CoFeSiB 0.5/Pd 1.4]$_{10}$/Ta. The first sample was formed by dc sputtering, a [CoFeSiB/Pd] multilayer thin film of the first sample was stacked 10 times, and the first sample exhibits perpendicular magnetic anisotropy before an annealing process. The first sample exhibits stronger perpendicular magnetic anisotropy after annealing at temperatures of 300 degrees Celsius, 400 degrees Celsius, and 500 degrees Celsius.

The first sample exhibits low coercivity of about 500 oersteds (Oe) when annealing is not performed, exhibits coercivity of about 1 kOe when annealing of 300 degrees Celsius is performed for an hour, and exhibits coercivity of about 5 kOe when annealing of 500 degrees Celsius is performed for an hour.

Figure 3:
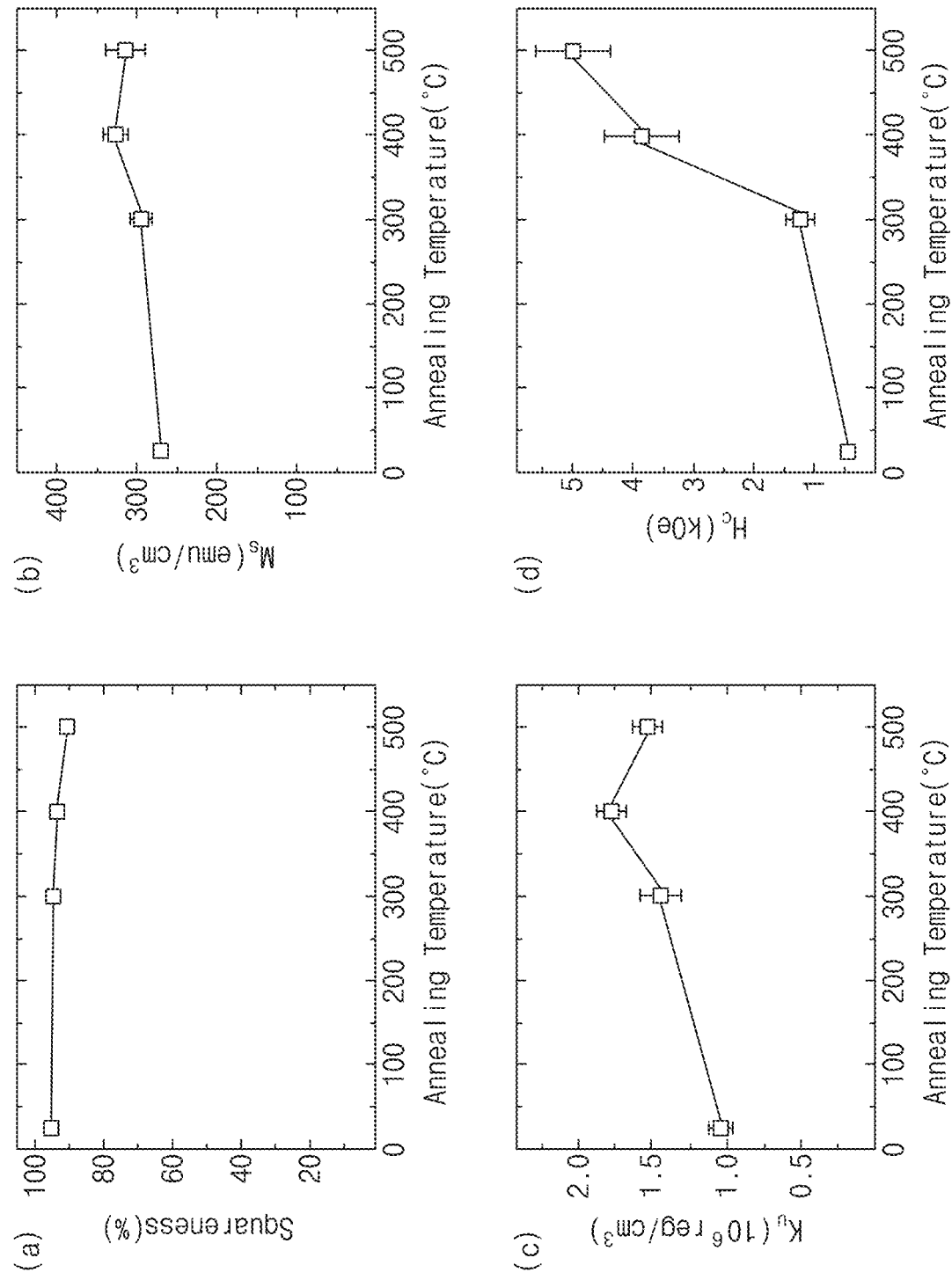
FIG. 3 (a)-(d) illustrate magnetic characteristics depending on an annealing temperature of a multilayer thin film according to an example embodiment of the present disclosure.

FIG. 3 illustrates magnetic characteristics depending on an annealing temperature of a multilayer thin film according to an example embodiment of the present disclosure.

Referring to FIG. 3(a), a squareness exceeded 90 percent irrespective of annealing. The squareness of 90 percent or more was maintained even after annealing of 500 degrees Celsius. The squareness ($M_r/M_s$) is defined as a ratio of remanent magnetization ($M_r$) to saturation magnetization ($M_s$).

Referring to FIG. 3(b), a saturation magnetization ($M_s$) value of about 300 emu/cm$^3$ was maintained irrespective of an annealing temperature. The saturation magnetization was calculated using the volume of the multilayer thin film 117 except for the seed layer 112, the Pb buffer layer 114, and the capping layer 118.

Referring to FIG. 3(c), effective uniaxial magnetic anisotropy energy ($K_{u,eff}$) increased as an annealing temperature increased and exhibited $1.77\times10^6$ erg/cm$^3$ after annealing of 400 degrees Celsius.

Referring to FIG. 3(d), coercivity $H_c$ rapidly increased during annealing of 300 degrees Celsius and exhibited 5000 Oe after annealing of 500 degrees Celsius. Based on the magnetic characteristics, the [CoFeSiB/Pd] multilayer thin film 117 may be used as a pinned layer of a magnetic tunnel junction. To simulate a BEOL process, when annealing is performed at a temperature ranging from 300 to 600 degrees Celsius for an hour or more, the [CoFeSiB/Pd] multilayer thin film 117 maintains perpendicular magnetic anisotropy. The [CoFeSiB/Pd] multilayer thin film 117 exhibits high coercivity of 3 kOe or higher, constant saturation magnetization of about 300 emu/cm$^3$, and high magnetic anisotropy energy of the level of $1.77\times10^6$ erg/cm$^3$. Variation in the coercivity is predicted to result from change of a fine structure of the thin film when annealing is performed. The

[CoFeSiB/Pd] multilayer thin film 117 may be used as a pinned layer of a magnetic tunnel junction.

Figure 4:
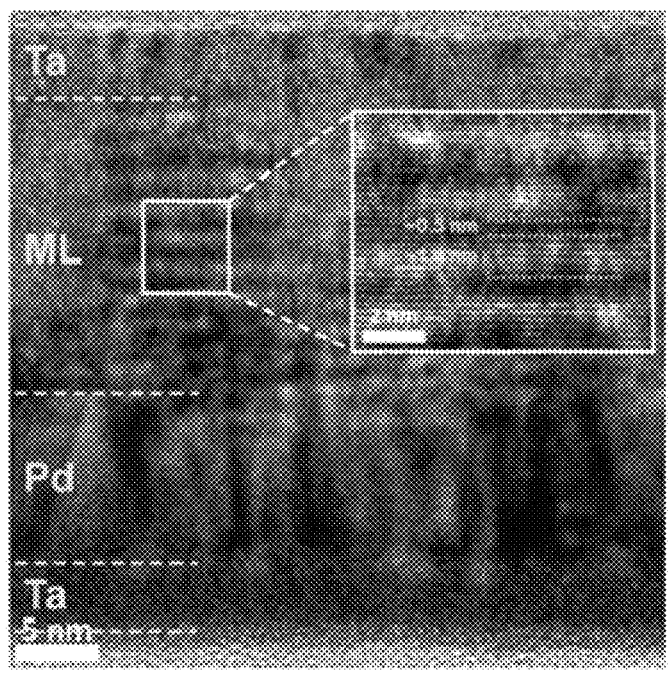
FIG. 4 (a)-(b) are cross-sectional images of a thin film specimen obtained using a transmission electron microscope (TEM).
Figure 4:
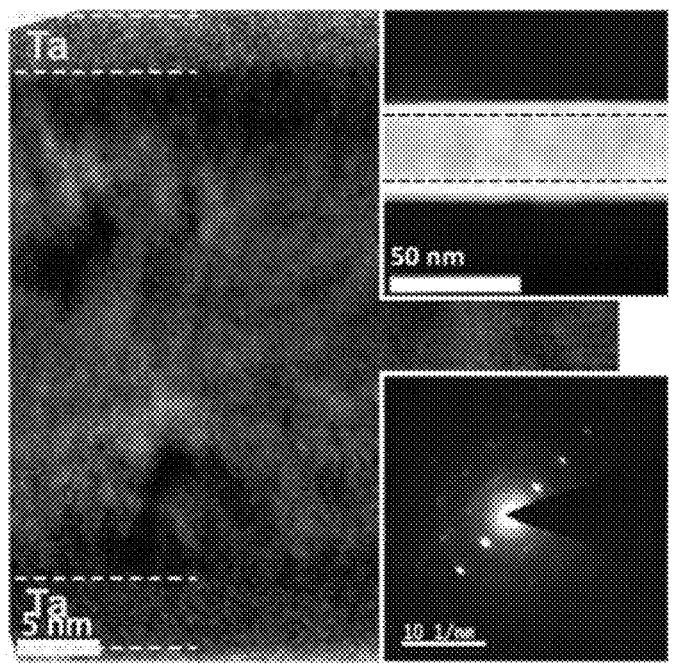

FIG. 4 (a)-(b) are cross-sectional images of a thin film specimen obtained using a transmission electron microscope (TEM).

FIG. 4(a) is a cross sectional TEM image before annealing, and FIG. 4(b) is a TEM image after annealing of 500 degree Celsius. Before annealing, the [CoFeSiB/Pd] multilayer thin film 117 includes a stack including a CoFeSiB layer having a thickness of 0.5 nm and a Pd layer having a thickness of 1.4 nm. After annealing of 500 degrees Celsius, the perpendicular magnetic anisotropy thin film 110 exhibits a structure including a seed layer 112 of Ta, a capping layer 118 of Ta, and an alloy layer disposed between the seed layer 112 and the capping layer 118. The alloy layer has a polycrystalline structure. After the annealing of 500 degrees Celsius, a boundary between the [CoFeSiB/Pd] multilayer thin film 117 and the buffer layer 114 disappeared and the [CoFeSiB/Pd] multilayer thin film 117 and the buffer layer 114 were transformed to an alloy layer of single polycrystalline phase. While annealing is performed, interdiffusion occurs between the [CoFeSiB/Pd] multilayer thin film 117 and the buffer layer 114. Through the annealing process, it can be confirmed that the CoFeSiB layer changes from an amorphous structure to a polycrystalline alloy structure. Nevertheless, the perpendicular magnetic anisotropy multilayer thin film 110 maintained the perpendicular magnetic anisotropy.

Figure 5:
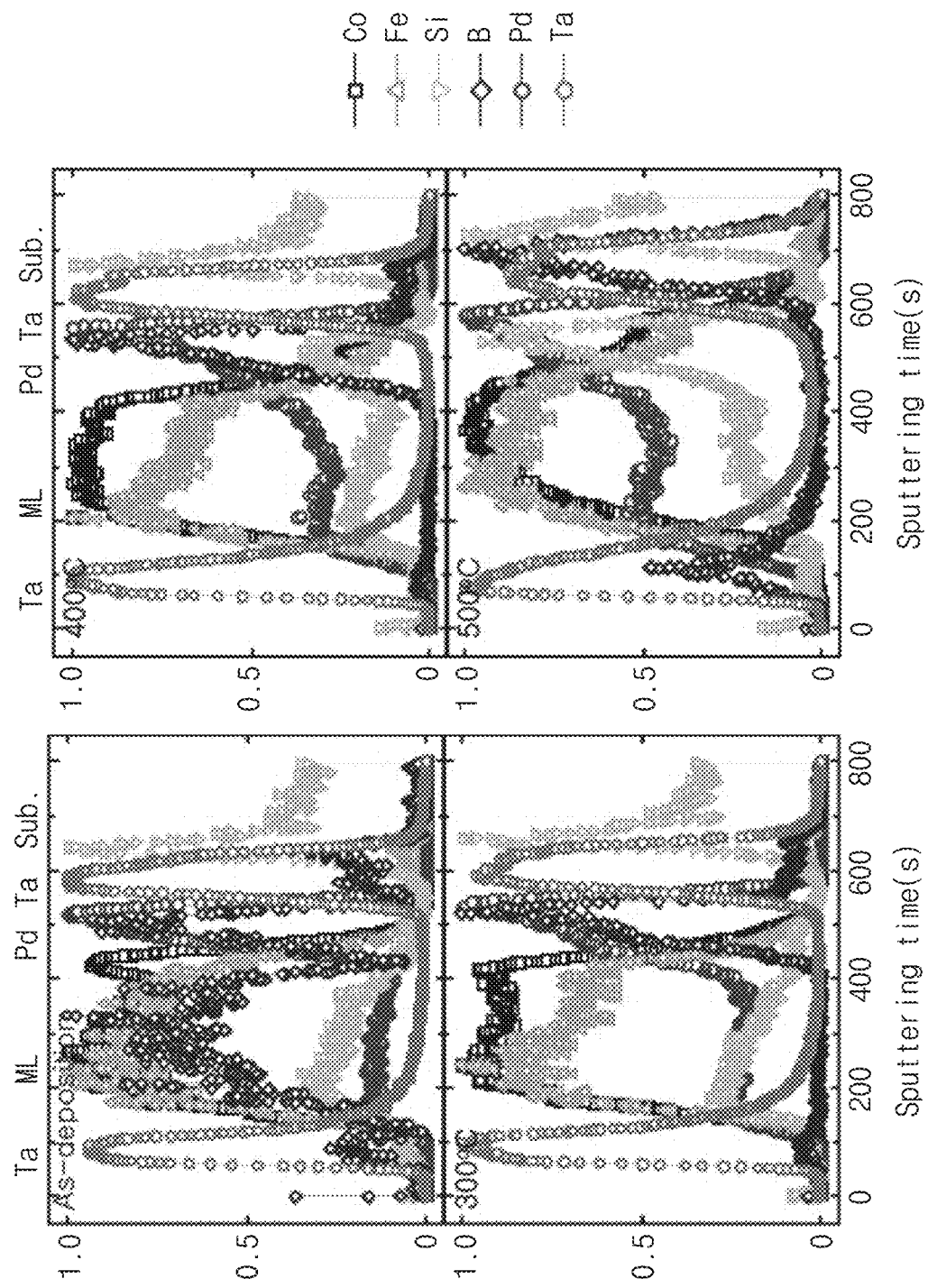
FIG. 5 illustrates a result of depth-direction element analysis depending on an annealing temperature measured by a secondary ion mass spectroscopy (SIMS).

FIG. 5 illustrates a result of depth-direction element analysis depending on an annealing temperature measured by a secondary ion mass spectroscopy (SIMS).

Referring to FIG. 5, elemental depth profiles of a thin film were measured by the secondary ion mass spectroscopy (SIMS) using $Cs^+$ ions.

A [CoFeSiB/Pd] multilayer thin film and a buffer layer are clearly distinguished from each other before annealing, and it can be confirmed that Pd elements of the buffer layer are diffused to the [CoFeSiB/Pd] multilayer thin film as the annealing is performed. Most boron (B) elements move to the buffer layer when annealing of 300 degrees Celsius is performed and move to the capping layer 118 and the seed layer 112 when annealing of 500 degrees Celsius is performed.

Figure 6:
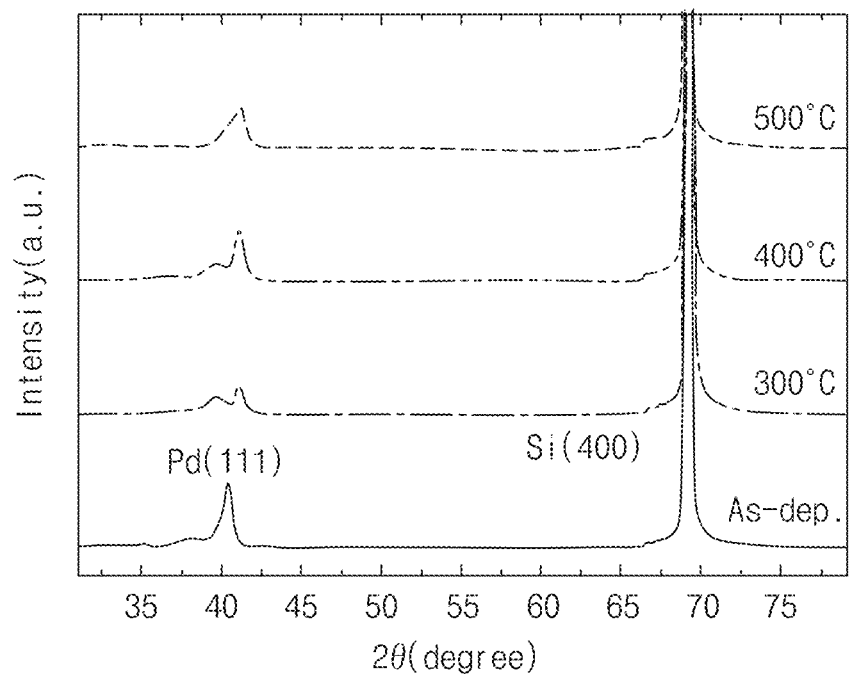
FIG. 6 illustrates X-ray diffraction (XRD) patterns of a multilayer thin film according to an example embodiment of the present disclosure.
Figure 6:
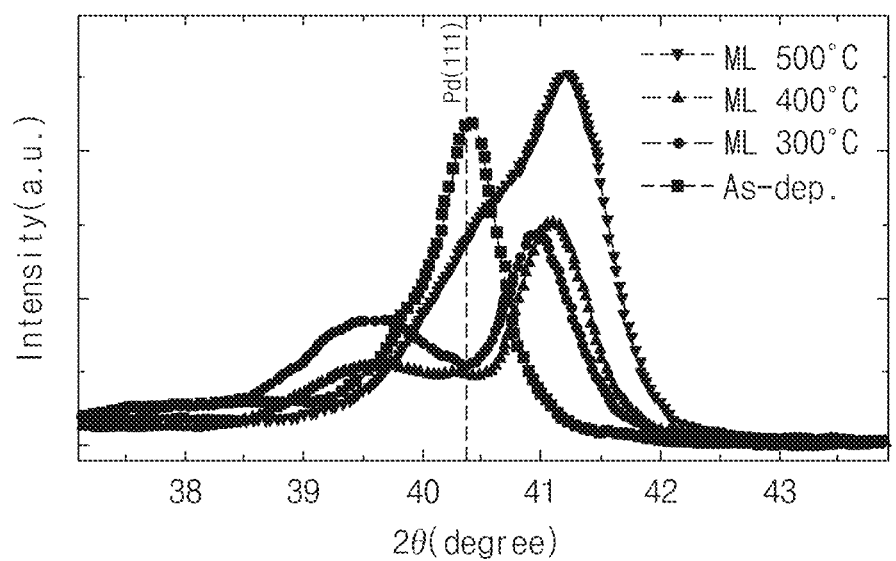

FIG. 6 illustrates X-ray diffraction (XRD) patterns of a multilayer thin film according to an example embodiment of the present disclosure.

Referring to FIG. 6, it can be confirmed that a CoPd-based alloy or an intermetallic compound is produced after annealing. It is known that boron (B) is diffused into the Pd layer 111, which is a buffer layer, to extend a Pd lattice. In a post-deposition annealing state, a peak of 40.36 degree Celsius results from a face-centered cubic (fcc) (111)-Pd. After the annealing of 300 degrees Celsius, a Pd peak is divided into two Pd peaks. A peak position of the buffer layer moves at a low angle due to the B diffusion during the annealing. The estimated composition of interstitial B atoms in the Pd matrix considering the lattice parameter changes is between 5 and 6 atomic percent (at. %).

After the annealing of 500 degrees Celsius, an XRD peak position of the [CoFeSiB/Pd] multilayer thin film is 41.2 degrees. The peak is very close to peaks of CoPd (41.0 degrees) and $CoPd_3$ (40.9 degrees) oriented in a (111) direction.

Compositions of Co and Pd that are two main components of the multilayer thin film are 19 at. % and 81 at. %, respectively. Although the [CoFeSiB/Pd] multilayer thin film is not a pure binary Co—Pd system, main components are Co and Pd and the amounts of the other components are small. Thus, an alloy formed after annealing can be regarded as a Pd-rich Co—Pd alloy. Although the perpendicular magnetic anisotropy of the [CoFeSiB/Pd] multilayer thin film in the as-deposited state can be attributed to an interfacial effect, the main origin of the perpendicular magnetic anisotropy of both the [CoFeSiB/Pd] multilayer thin film that underwent high-temperature annealing is thought to result from a bulk effect.

Figure 7:
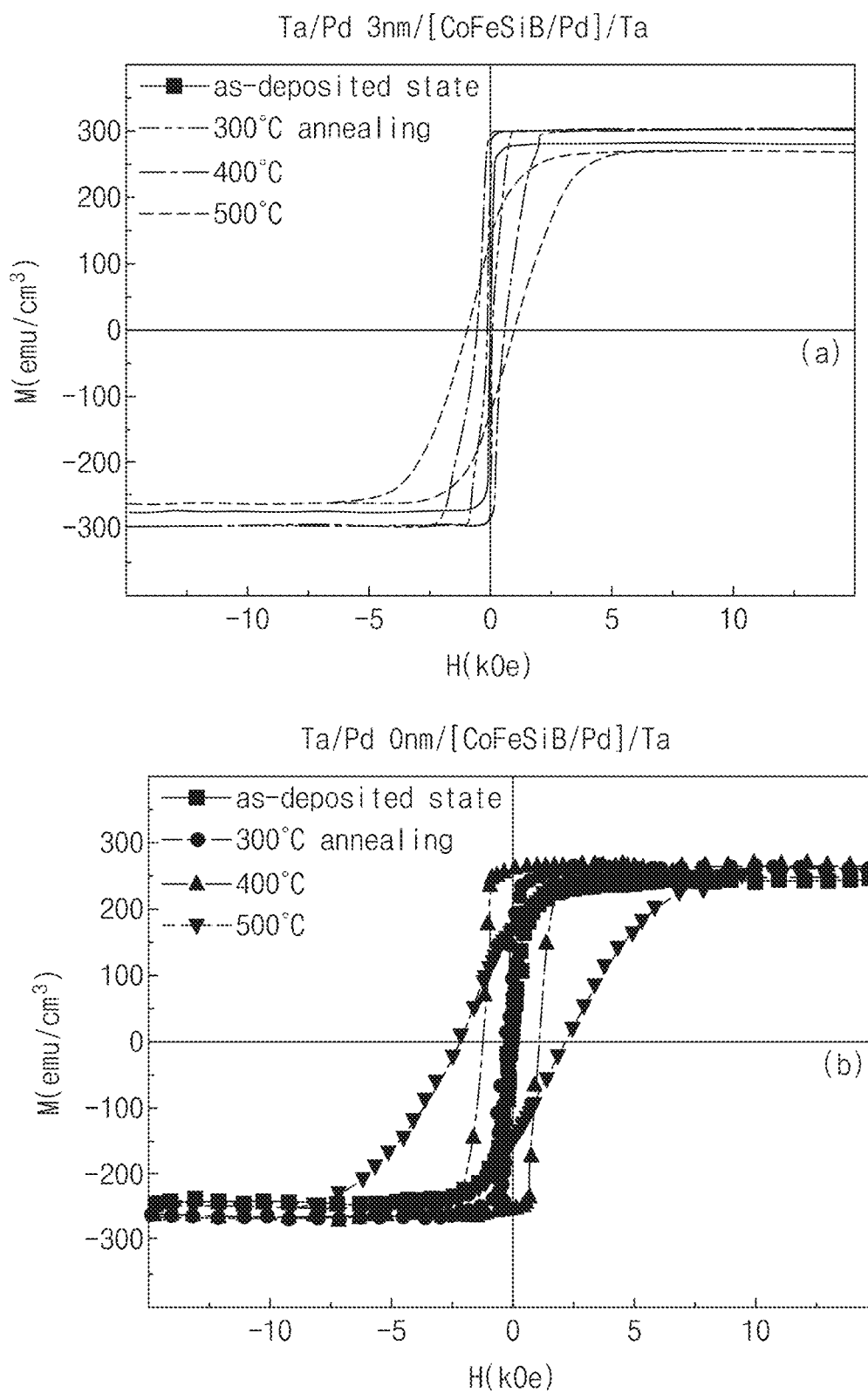
FIG. 7 (a)-(b) show a magnetic hysteresis curve of a multilayer thin film depending on a thickness of a Pd buffer layer.

FIG. 7 (a)-(b) show a magnetic hysteresis curve of a multilayer thin film depending on a thickness of a Pd buffer layer.

FIG. 7 (a) indicates the case where a thickness of a buffer layer is 3 nm and FIG. 7 (b) indicates the case where there is no buffer layer. Among perpendicular anisotropy characteristics, a noteworthy change was not observed even when the buffer layer 114 decreases from 10 nm to 5 nm. However, a magnetic characteristic was significantly changed when the buffer layer 114 decreases to 3 nm. A second ample has a Ta/Pd 3 nm/[CoFeSiB 0.5/Pd 1.4]$_{10}$/Ta structure, and a third sample has a Ta/Pd 0 nm/[CoFeSiB 0.5/Pd 1.4]$_{10}$/Ta structure.

The second sample does not exhibit sufficient post-annealing coercivity even before annealing, and the third sample does not exhibit sufficient post-annealing coercivity even before annealing. Thus, a [CoFeSiB/Pd]n multilayer thin film needs to include a buffer layer of at least 3 nm to be used as a magnetic layer of a magnetic tunnel junction.

Figure 8:
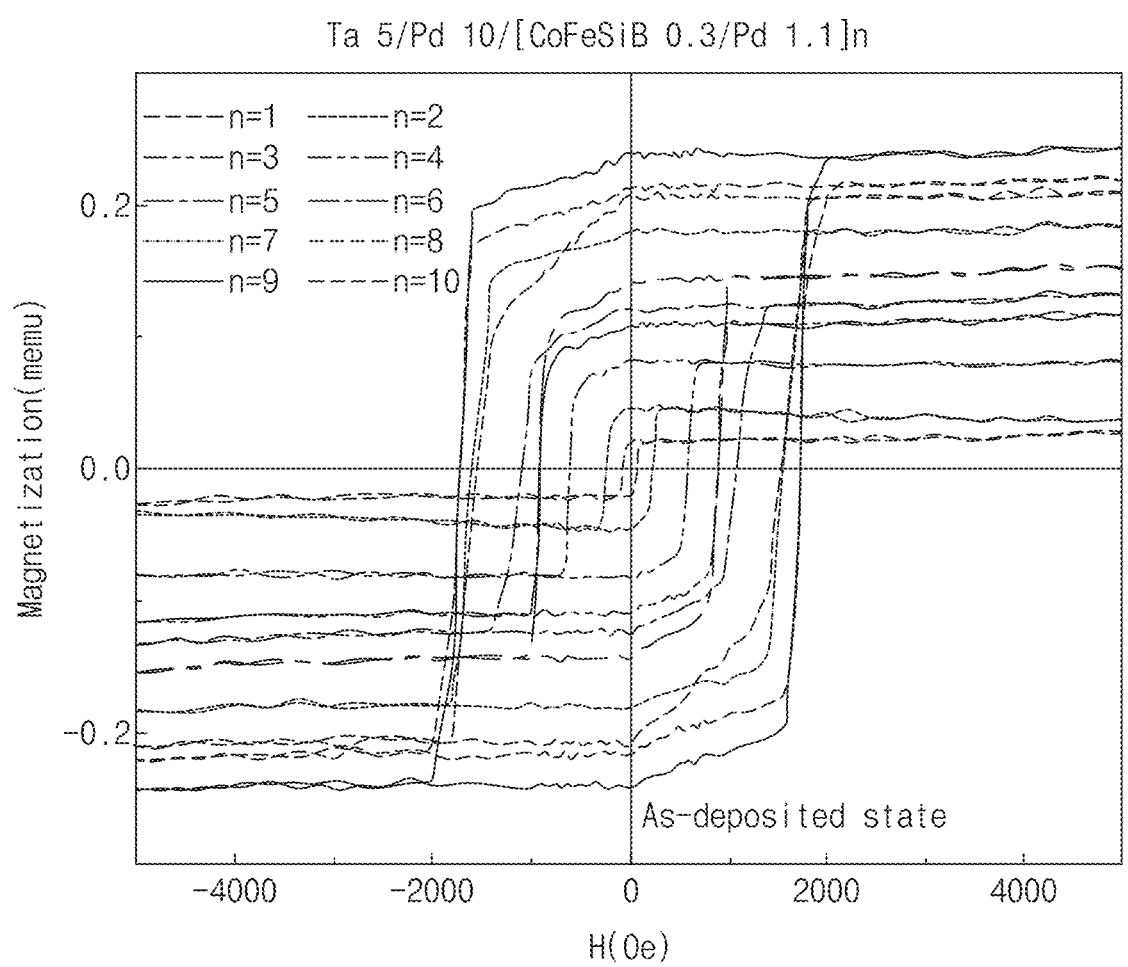
FIG. 8 shows a magnetic hysteresis curve depending on the number of times a [CoFeSiB/Pd] multilayer thin film is stacked.

FIG. 8 shows a magnetic hysteresis curve depending on the number of times a [CoFeSiB/Pd] multilayer thin film is stacked.

Referring to FIG. 8, a curve is a magnetic hysteresis curve of a Ta/Pd 10/[CoFeSiB 0.3/Pd 1.1]n/Ta structure before annealing. As the number of times stacked (n) increases from 1 to 10, coercivity and saturation magnetization increase. Thus, the number of times the multilayer thin film is stacked may be selected to achieve suitable coercivity, saturation magnetization, squareness or perpendicular anisotropy energy. In the case where the number of times stacked (n) is 3 or more the perpendicular magnetic anisotropy is maintained even after annealing of 500 degrees Celsius.

Figure 9:
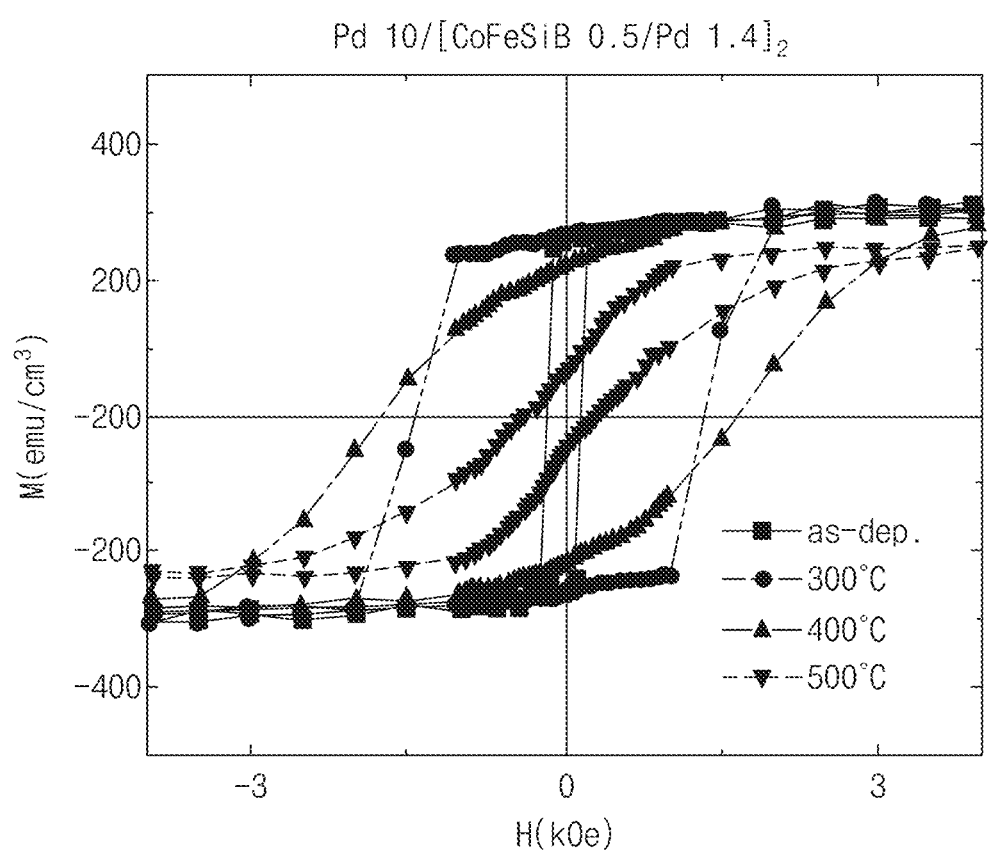
FIG. 9 shows a magnetic hysteresis curve depending on an annealing temperature of a [CoFeSiB/Pd]$_2$ multilayer thin film.

FIG. 9 shows a magnetic hysteresis curve depending on an annealing temperature of a [CoFeSiB/Pd]$_2$ multilayer thin film.

Referring to FIG. 9, a curve is a magnetic hysteresis curve of a Ta/Pd 10/[CoFeSiB0.5/Pd1.4]$_2$/Ta structure. In the case where the number of times stacked (n) is 2, perpendicular magnetic anisotropy is exhibited when annealing of 300 degrees Celsius is performed. However, the perpendicular magnetic anisotropy is lost when annealing of 400 degrees Celsius or greater is performed. Thus, the number of times staked (n) is preferably 3 or more.

Figure 10:
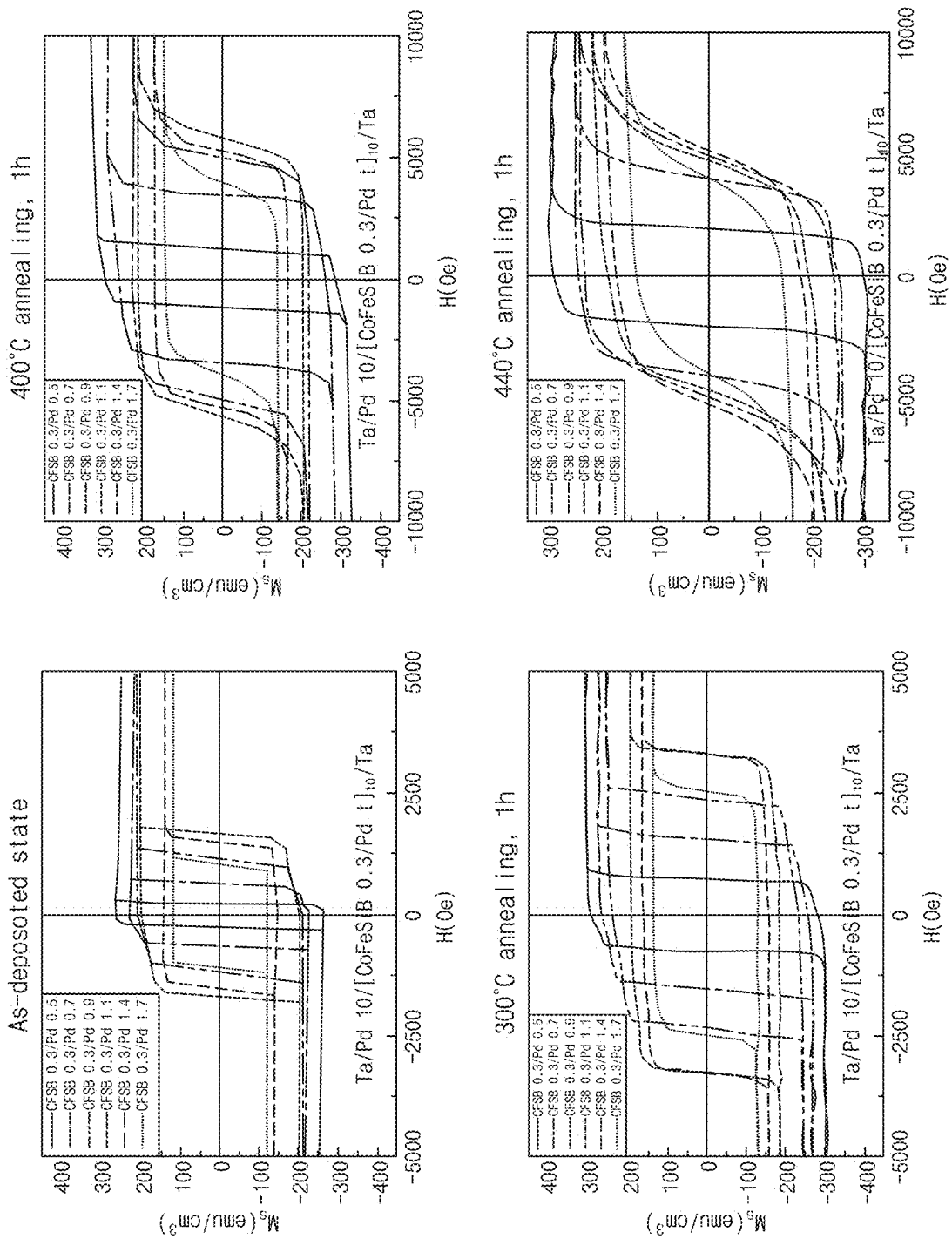
FIG. 10 shows a magnetic hysteresis curve depending on thicknesses of a CoFeSiB/Pd layer and a Pd layer of a [CoFeSiB/Pd]$_{10}$ multilayer thin film.

FIG. 10 shows a magnetic hysteresis curve depending on thicknesses of a CoFeSiB/Pd layer and a Pd layer of a [CoFeSiB/Pd]$_{10}$ multilayer thin film.

Referring to FIG. 9, a curve is a magnetic hysteresis curve of a Ta/Pd 10/[CoFeSiB 0.3/Pd]$_{10}$/Ta structure, the number of time stacked (n) is 10, a thickness of a CoFeSiB layer is fixed to 0.3 nm, and a thickness of a Pd layer changes within the range between 0.5 and 1.7 nm. A ratio of the thickness of the CoFeSiB layer to the thickness of the Pd layer may be 1:1.6 to 1:7. The thickness of the CoFeSiB layer may be 0.3 nm or more.

When the thickness of the Pd layer increases compared with the thickness of the CoFeSiB layer, saturation magnetization may decrease and coercivity may increase. A ratio of the thickness of the CoFeSiB layer to the thickness of the Pd layer may be 1:1.6 to 1:7. Thus, the ratio of the thickness of the CoFeSiB layer to the thickness of the Pd layer may be selected to achieve suitable coercivity, saturation magnetization, squareness or perpendicular anisotropy energy. The perpendicular magnetic anisotropy is maintained even after annealing of 500 degrees Celsius. A thickness of the [CoFeSiB/Pd] multilayer thin film may be preferably between 9.5 and 20 nm.

Figure 11:
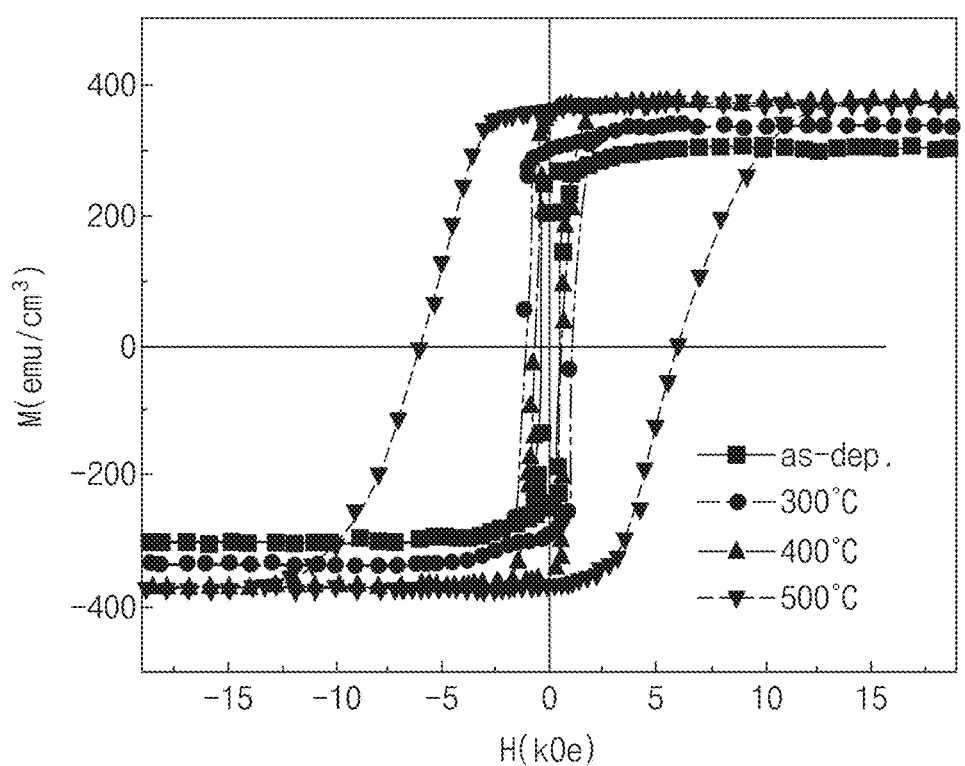
FIG. 11 shows a magnetic hysteresis curve depending on thicknesses of a CoFeSiB/Pd layer and a Pd layer of a [CoFeSiB/Pd]$_9$ multilayer thin film.

FIG. 11 shows a magnetic hysteresis curve depending on thicknesses of a CoFeSiB/Pd layer and a Pd layer of a [CoFeSiB/Pd]$_9$ multilayer thin film.

Referring to FIG. 11, a curve is a magnetic hysteresis curve of a Ta 5/Pd 10/[CoFeSiB 0.5/Pd 1.4]$_{10}$/CoFeSiB 0.5/Ta 0.4/CoFeB 1.0/MgO 1.0/Ta 5 structure and perpendicular magnetic anisotropy is maintained even after annealing of 500 degrees Celsius. The structure may be applied to CoFeB/MgO/CoFeB to improve a TMR value of a magnetic tunnel junction. Even in this case, the perpendicular magnetic anisotropy may be maintained.

Figure 12A:
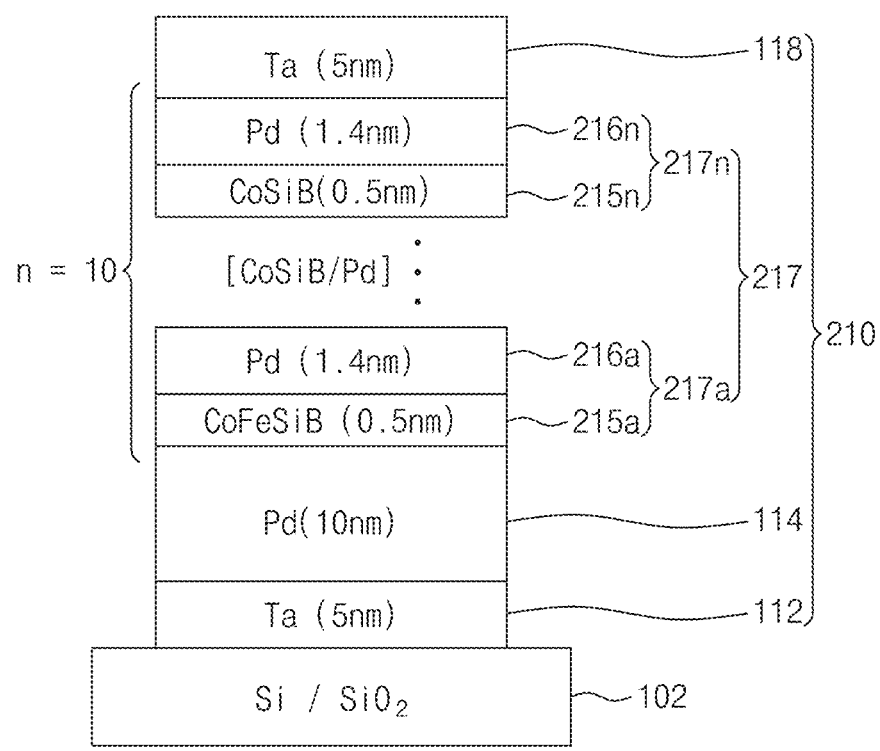
FIG. 12A is a conceptual diagram illustrating a perpendicular magnetic anisotropy multilayer thin film according to another example embodiment of the present disclosure.

FIG. 12A is a conceptual diagram illustrating a perpendicular magnetic anisotropy multilayer thin film according to another example embodiment of the present disclosure.

Figure 12B:
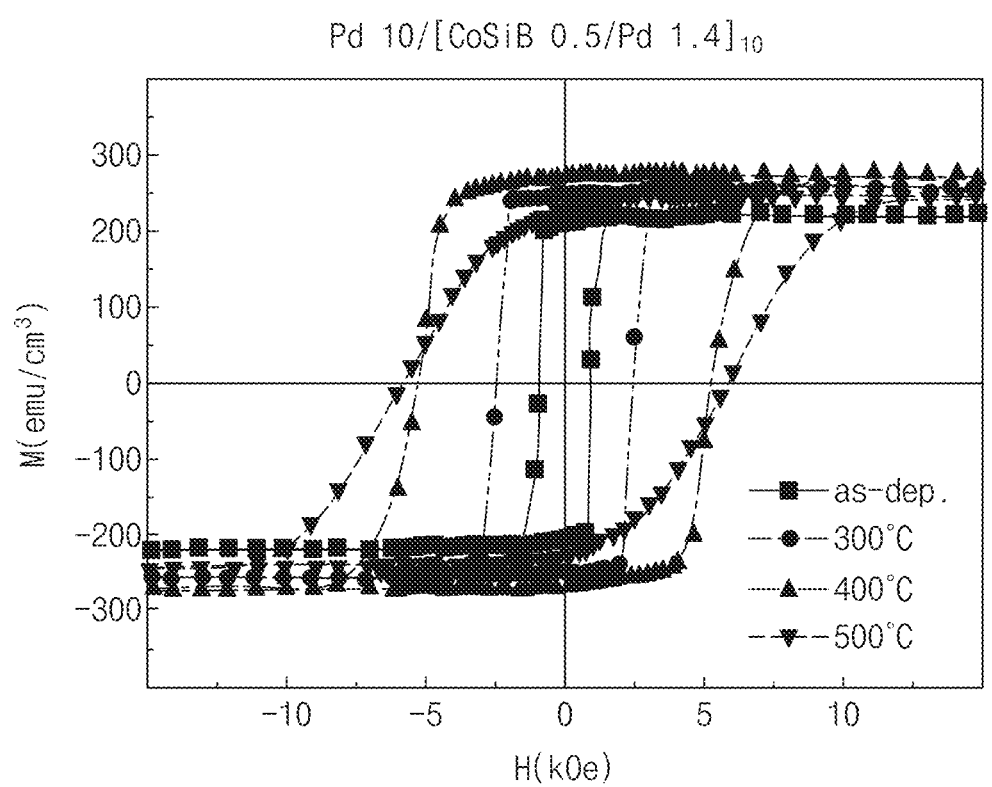
FIG. 12B shows a magnetic hysteresis curve of the perpendicular magnetic anisotropy multilayer thin film in FIG. 12A.

FIG. 12B shows a magnetic hysteresis curve of the perpendicular magnetic anisotropy multilayer thin film in FIG. 12A.

Referring to FIGS. 12A and 12B, a perpendicular magnetic anisotropy thin film 210 may include a seed layer 112, a buffer layer 114, a [CoSiB/Pd] multilayer thin film 217, and a capping layer 118. The seed layer 112 is Ta of 5 nm, the buffer layer 114 is Pd of 10 nm, and the [CoSiB/Pd] multilayer thin film 217 includes a CoSiB layer 215a of 0.5 nm and a Pd layer 216a of 1.4 nm. The number of times the [CoSiB/Pd] multilayer thin film 217 is stacked may be between 3 and 10. The capping layer 118 may be Ta of 5 nm.

A method for forming a perpendicular magnetic anisotropy multilayer thin film includes alternately sputtering a CoSiB target and a Pd target inside a vacuum chamber to form a [CoSiB/Pd] multilayer thin film on a substrate 102 disposed inside the vacuum chamber. A buffer layer 114 may be formed before the [CoSiB/Pd] multilayer thin film 217 is formed. A seed layer 112 may be formed before the buffer layer 114 is formed. A capping layer 118 may be formed after the [CoSiB/Pd] multilayer thin film 217 is formed. The [CoSiB/Pd] multilayer thin film 217 may be formed by dc sputtering method using the CoSiB target and the Pd target. A composition ratio of the CoSiB target may be Co$_{75}$Si$_{15}$B$_{10}$ (atomic percent). The [CoSiB/Pd] multilayer thin film 217 may be deposited under an atmosphere of argon and an atmosphere of 1 mTorr to 10 mTorr. A ratio of a thickness of CoSiB to a thickness of Pd may be 1:1.6 to 1:7. The total thickness of the [CoSiB/Pd] multilayer thin film 217 may be between 9.5 and 20 nm.

The perpendicular magnetic anisotropy thin film 210 may maintain perpendicular magnetic anisotropy even after annealing of 300 to 500 degrees Celsius for an hour.

Figure 13:
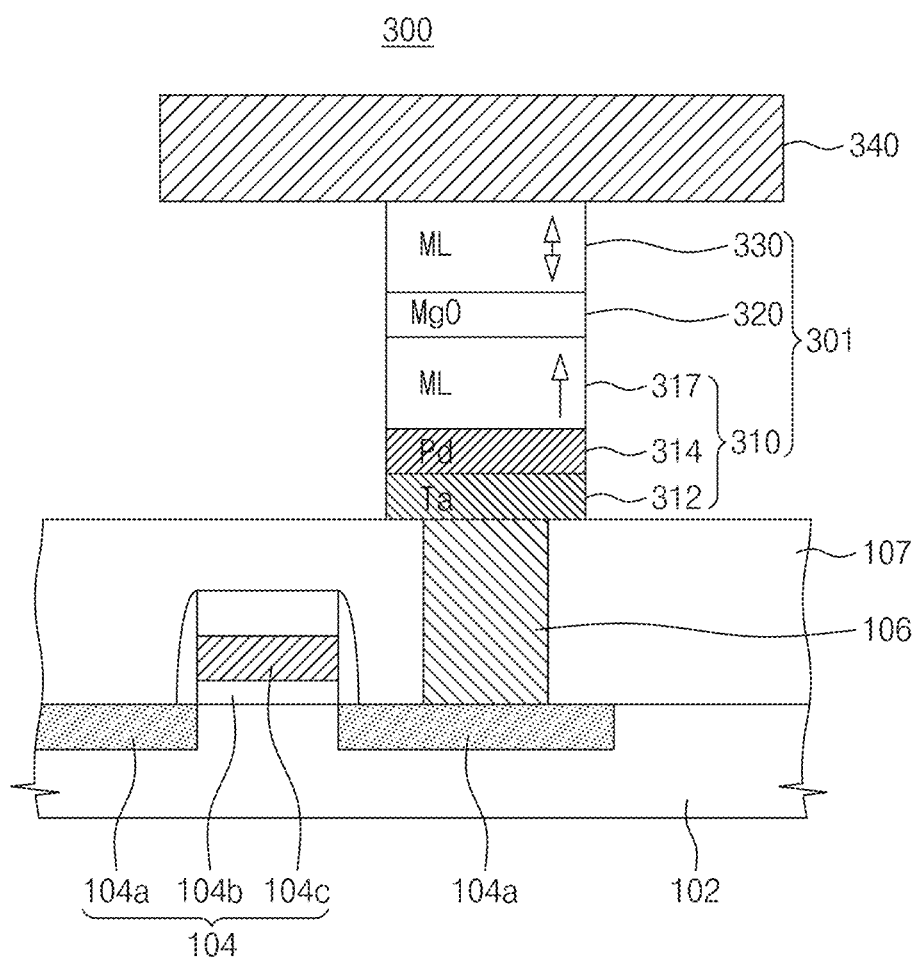
FIG. 13 is a conceptual diagram of a magnetic memory device according to an example embodiment of the present disclosure.

FIG. 13 is a conceptual diagram of a magnetic memory device according to an example embodiment of the present disclosure.

Referring to FIG. 13, a magnetic memory device 300 may include a selection transistor 104 and a magnetic tunnel junction 301. The magnetic tunnel junction 301 may include a tunnel insulating layer 320 interposed between a free layer 330 whose magnetization direction is switched and a pinned layer 310 whose magnetization direction is fixed. The pinned layer 310 may include a seed layer 312, a buffer layer 314 disposed on the seed layer 312, and a first pinned layer 317 disposed on the buffer layer 314. The seed layer 312 may be Ta, and the buffer layer 314 may be Pd. The first pinned layer 317 may include a [CoFeSiB/Pd] multilayer thin film or a [CoSiB/Pd] multilayer thin film. The [CoFeSiB/Pd] multilayer thin film or the [CoSiB/Pd] multilayer thin film of the first pinned layer 317 may maintain perpendicular magnetic anisotropy even after annealing of 300 to 500 degree Celsius for an hour.

The selection transistor 104 may include a gate insulating layer 104b disposed on a substrate, a gate electrode 104c disposed on the gate insulating layer 104b, and impurity regions 104a formed at opposite sides adjacent to the gate insulating layer 104b. The impurity region 104a of the selection transistor 104 may be electrically connected to the magnetic tunnel junction 301. A conductivity type of the impurity region 104a may be opposite to that of a channel region below the gate insulating layer 104b. A first interlayer dielectric 106 is disposed to cover the selection transistor 104. The impurity region 104a may provide a source and a drain. A contact plug 106 may be disposed to be in contact with the impurity region 104a through the first interlayer dielectric 106. A magnetic tunnel junction may be disposed on the contact plug 104.

The magnetic tunnel junction 301 may include a pinned layer 310, a tunnel insulating layer 320, and a free layer 330 that are sequentially stacked. The pinned layer 310 may include a seed layer 312, a buffer layer 314, and a first pinned layer 317 that are sequentially stacked. The seed layer 312 may be Ta, the buffer layer 314 may be Pd, and the first pinned layer 317 may include a multilayer thin film of [CoFeSiB/Pd] or [CoSiB/Pd] that are alternately deposited. The number of times the multilayer thin film of [CoFeSiB/Pd] or [CoSiB/Pd] is stacked may be 3 or more. The first pinned layer 317 may maintain perpendicular magnetic anisotropy even after annealing of a temperature higher than 300 degrees Celsius and lower than 600 degrees Celsius.

A tunnel insulating layer 220 may be disposed on the pinned layer 310. The tunnel insulating layer 320 may be deposited in a crystalline state by sputtering an MgO target.

A free layer 330 may be disposed on the tunnel insulating layer 320. The free layer 330 may a [CoFeSiB/Pd] multilayer thin film or a [CoSiB/Pd] multilayer thin film formed by DC sputtering. The free layer may exhibit perpendicular magnetic anisotropy during deposition. Magnetic characteristics of the free layer 330 may be different from those of the pinned layer 317. More specifically, saturation magnetization of the first pinned layer 317 may be greater than that of the free layer 330. In addition, coercivity of the first pinned layer 317 may be greater than that of the free layer 330.

According to a modified embodiment of the present disclosure, the free layer 300 may be transformed into another material having perpendicular magnetic anisotropy.

A conductive pattern 340 may be disposed on the free layer 330. The free layer 330 contacting the conductive pattern 340 may be switched by a spin-transfer torque caused by current flowing through the magnetic tunnel junction 301. Alternatively, the free layer 330 may be switched by a spin-transfer torque or a spin-orbit torque.

In the magnetic memory device 300 according to the example embodiment, the first interlayer dielectric 107 is deposited after the selection transistor 104 is formed on the substrate 102. A top surface of the first interlayer dielectric 107 may be planarized. A contact hole in which the contact plug 106 is to be disposed is formed by performing a patterning process on the first interlayer dielectric 107. After a conductor filling the contact hole is buried in the substrate 102 where the contact hole is formed, a contact plug 106 may be formed by an etch-back process.

A pinned layer 310, a tunnel insulating layer 320, and a free layer 330 are sequentially formed on the first interlayer dielectric 107. The pinned layer 310, the tunnel insulating layer 320, and the free layer 330 are patterned by a patterning process to form a magnetic tunnel junction 301.

Figure 14:
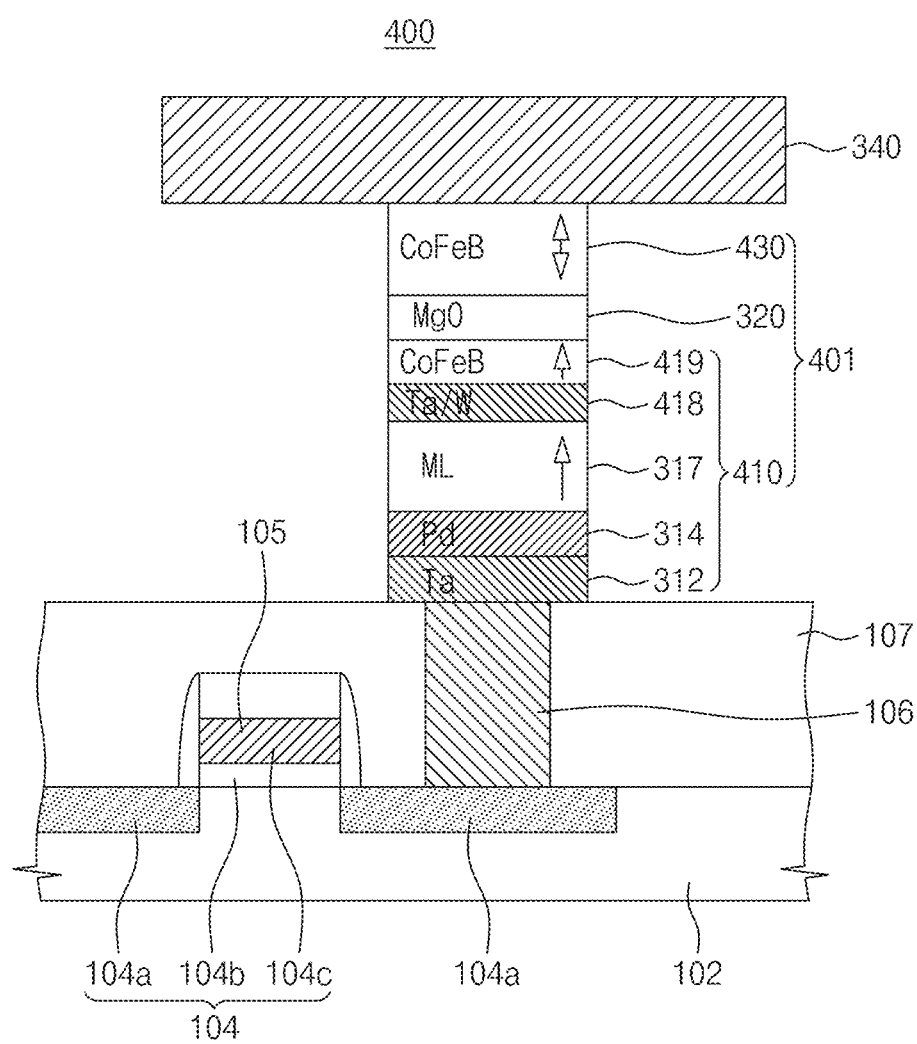
FIG. 14 is a conceptual diagram of a magnetic memory device according to an example embodiment of the present disclosure.

FIG. 14 is a conceptual diagram of a magnetic memory device according to an example embodiment of the present disclosure.

Referring to FIG. 14, a magnetic memory device 400 may include a selection transistor 104 and a magnetic tunnel junction 401. The magnetic tunnel junction 401 may include a tunnel insulating layer 320 interposed between a free layer 430 whose magnetization direction is switched and a pinned layer 410 whose magnetization direction is fixed. The pinned layer 410 may include a seed layer 312, a buffer layer 314 disposed on the seed layer 312, a first pinned layer 317 disposed on the buffer layer 314, a non-magnetic conductive layer 418 disposed on the first pinned layer 317, and a second pinned layer 419 disposed on the non-magnetic conductive layer 418. The first pinned layer 317 may include a [CoFeSiB/Pd] multilayer thin film or a [CoSiB/Pd] multilayer thin film. The number of times the [CoFeSiB/Pd] multilayer thin film or the [CoSiB/Pd] multilayer thin film is stacked may be 3 or more. The non-magnetic conducive layer 418 may be Ta or tungsten (W). The second pinned layer 419 may be amorphous CoFeB having perpendicular magnetic anisotropy after subsequent annealing. The first pinned layer 317 may have the same magnetization direction as the second pinned layer 419. The non-magnetic conductive layer 418 may be Ta or W of 0.4 to 0.6 nm. The second pinned layer 419 may be CoFeB of about 1 nm.

Conventionally, in the case where amorphous CoFeB is used as a magnetic layer, when annealing of 300 degrees Celsius or more is performed to exhibit perpendicular magnetic anisotropy, the amorphous CoFeB is crystallized. If annealing of 400 degree Celsius or more is performed, the crystallized CoFeB loses the perpendicular magnetic anisotropy.

However, in the case where a structure including the first pinned layer 317, the non-magnetic conductive layer 418, and the second pinned layer 419 is used, when annealing of 300 to 600 degrees Celsius is performed, the first pinned layer 317 (or [CoSiB/Pd] multilayer thin film) maintains perpendicular magnetic anisotropy and the second pinned layer 419 (or CoFeB) also maintains perpendicular magnetic anisotropy.

A tunnel insulating layer 220 may be disposed on the second pinned layer 419. The tunnel insulating layer 320 may be formed by sputter-deposition and may be MgO of about 1 nm having crystallinity in the as-deposited state.

A free layer 430 is disposed on the tunnel insulating layer 220. The free layer 430 may be CoFeB. Thus, the magnetic tunnel junction 401 may maintain a high TMR value caused by a CoFeB/MgO/CoFeB structure.

According to an example embodiment of the present disclosure, after the first pinned layer 317, the second pinned layer 419, the tunnel insulating layer 320, and the free layer 430 are formed, they may be annealed. Thus, after the free layer 430 is formed, separate auxiliary annealing may be performed for the free layer 430 that is in the amorphous state. A temperature of the auxiliary annealing may be lower than that of annealing for providing perpendicular magnetic anisotropy to the first pinned layer 216.

As described above, a magnetic layer according to an example embodiment of the present disclosure may easily implement perpendicular magnetic anisotropy by using a [CoFeSiB/Pd] multilayer thin film or a [CoSiB/Pd] multilayer thin film. The [CoFeSiB/Pd] multilayer thin film or the [CoSiB/Pd] multilayer thin film may maintain perpendicular magnetic anisotropy even after annealing and may exhibit constant saturation magnetization irrespective of high squareness, high perpendicular anisotropy energy, and annealing temperature.

Although the present disclosure and its advantages have been described in detail, it should be understood that various changes, substitutions and alterations can be made herein without departing from the spirit and scope of the disclosure as defined by the following claims.

What is claimed is:

1. A method for forming a CoFeSiB/Pd multilayer thin film exhibiting perpendicular magnetic anisotropy, the method comprising:
    alternate sputtering a CoFeSiB target and a Pd target inside a vacuum chamber to form the [CoFeSiB/Pd] multilayer thin film on a substrate disposed inside the vacuum chamber, and performing a post-deposition annealing after forming the [CoFeSiB/Pd] multilayer thin film;
    wherein a number of times the [CoFeSiB/Pd] multilayer thin film is stacked is 3 or more;
    wherein the method further comprises forming a buffer layer before forming the [CoFeSiB/Pd] multilayer thin film, wherein the buffer layer is Pd and has a thickness of 3 nm or more;
    wherein the post-deposition annealing temperature is 400 degrees Celsius or more; and
    wherein the [CoFeSiB/Pd] multilayer film has a squareness of 90 percent or more, a saturation magnetization of 300 emu/cm$^3$ or more, an effective magnetic anisotropy energy of $1.0 \times 10^6$ erg/cm$^3$ or more, and a coercivity of 3 kOe or more.

2. The method as set forth in claim 1, further comprising: forming a seed layer before forming the buffer layer; and forming a capping layer after forming the [CoFeSiB/Pd] multilayer thin film.

3. The method as set forth in claim 1, wherein the [CoFeSiB/Pd] multilayer thin film is formed by dc sputtering using the CoFeSiB target and the Pd target.

4. The method as set forth in claim 3, wherein a composition ratio of the CoFeSiB target is $Co_xFe_ySi_{15}B_{10}$ (atomic percent), and x=70.5~75 and y=4.5~0.

5. The method as set forth in claim 3, wherein the [CoFeSiB/Pd] multilayer thin film is deposited under an atmosphere of argon and an atmosphere of 1 mTorr to 10 mTorr.

6. The method as set forth in claim 3, wherein a ratio of a thickness of CoFeSiB to a thickness of Pd is 1:1.6 to 1:7.

* * * * *

UNITED STATES PATENT AND TRADEMARK OFFICE
CERTIFICATE OF CORRECTION

PATENT NO. : 10,858,730 B2  
APPLICATION NO. : 15/599259  
DATED : December 8, 2020  
INVENTOR(S) : Kim et al.

Page 1 of 1

It is certified that error appears in the above-identified patent and that said Letters Patent is hereby corrected as shown below:

On the Title Page

Item (30):  
Replace "(KR) 10-2016-017114"  
With -- (KR) 10-2016-0170114 --.

Signed and Sealed this  
Twenty-third Day of February, 2021

Drew Hirshfeld  
*Performing the Functions and Duties of the*  
*Under Secretary of Commerce for Intellectual Property and*  
*Director of the United States Patent and Trademark Office*